US009525136B1

(12) United States Patent
Egerton et al.

(10) Patent No.: US 9,525,136 B1
(45) Date of Patent: Dec. 20, 2016

(54) ULTRAVIOLET, INFRARED AND TERAHERTZ PHOTO/RADIATION SENSORS USING GRAPHENE LAYERS TO ENHANCE SENSITIVITY

(71) Applicant: Magnolia Optical Technologies, Inc., Woburn, MA (US)

(72) Inventors: Elwood J. Egerton, Hot Springs, SD (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 14/580,198

(22) Filed: Dec. 22, 2014

Related U.S. Application Data

(63) Continuation of application No. 13/308,688, filed on Dec. 1, 2011, now Pat. No. 8,916,825.

(51) Int. Cl.
*C01B 31/04* (2006.01)
*H01L 51/00* (2006.01)
(Continued)

(52) U.S. Cl.
CPC ......... *H01L 51/0048* (2013.01); *H01L 51/428* (2013.01); *H01L 51/44* (2013.01)

(58) Field of Classification Search
CPC ..... H01L 51/0048; H01L 51/428; H01L 51/44
(Continued)

(56) References Cited

U.S. PATENT DOCUMENTS 6,706,402 B2   3/2004   Rueckes et al.
7,723,684 B1   5/2010   Haddon et al.
(Continued)

FOREIGN PATENT DOCUMENTS

WO   0103208 A1   1/2001

OTHER PUBLICATIONS

Jiao, et al., Aligned Graphene Nanoribbons and Crossbars from Unzipped Carbon Nanotubes, Nano Res 2010; 3: 387-394.*
(Continued)

*Primary Examiner* — Daniel C McCracken
(74) *Attorney, Agent, or Firm* — Loginov & Associates, PLLC; William A. Loginov

(57) ABSTRACT

Ultraviolet (UV), Terahertz (THZ) and Infrared (IR) radiation detecting and sensing systems using graphene nanoribbons and methods to making the same. In an illustrative embodiment, the detector includes a substrate, single or multiple layers of graphene nanoribbons, and first and second conducting interconnects each in electrical communication with the graphene layers. Graphene layers are tuned to increase the temperature coefficient of resistance to increase sensitivity to IR radiation. Absorption over a wide wavelength range of 200 nm to 1 mm are possible based on the two alternative devices structures described within. These two device types are a microbolometer based graphene film where the TCR of the layer is enhanced with selected functionalization molecules. The second device structure consists of a graphene nanoribbon layers with a source and drain metal interconnect and a deposited metal of SiO2 gate which modulates the current flow across the phototransistor detector.

3 Claims, 7 Drawing Sheets

(51) Int. Cl.
*H01L 51/44* (2006.01)
*H01L 51/42* (2006.01)

(58) Field of Classification Search
USPC .......... 423/448; 204/157.43, 157.44, 157.47; 977/856
See application file for complete search history.

(56) References Cited

U.S. PATENT DOCUMENTS

| | | |
|---|---|---|
| 7,947,955 B2 | 5/2011 | Kawano et al. |
| 2008/0251723 A1 | 10/2008 | Ward et al. |
| 2011/0042650 A1 | 2/2011 | Avouris et al. |
| 2011/0253969 A1* | 10/2011 | Dai ................ B82Y 30/00 257/9 |
| 2012/0001761 A1 | 1/2012 | Voutilainen et al. |
| 2012/0161106 A1 | 6/2012 | Kim et al. |
| 2012/0212242 A1 | 8/2012 | Masel et al. |
| 2013/0018599 A1 | 1/2013 | Peng |

OTHER PUBLICATIONS

Jiao, et al., Facile synthesis of high-quality graphene nanoribbons, Nature Nanotechnology 2010; 5: 321-325.*
Jiao, et al., Narrow graphene nanoribbons from carbon nanotubes, Nature 2009; 458: 877-880.*

* cited by examiner

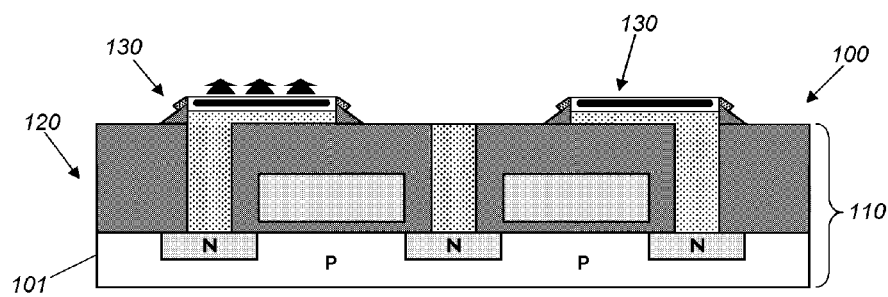
FIG. 1
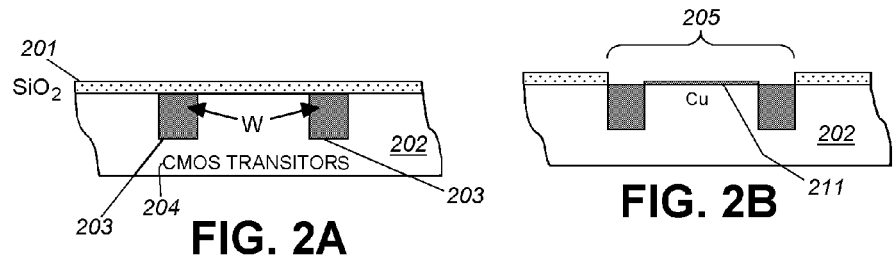
FIG. 2A        FIG. 2B
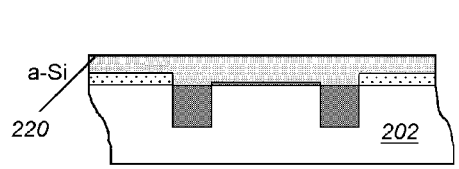 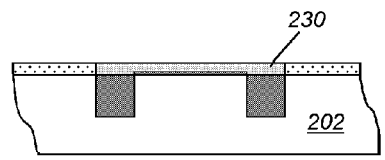
FIG. 2C        FIG. 2D
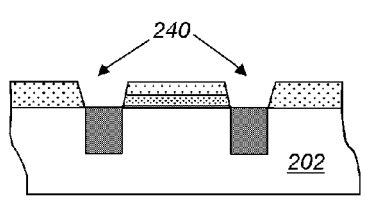 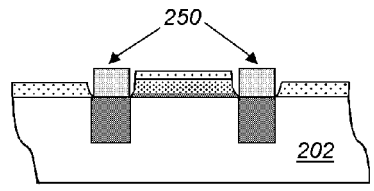
FIG. 2E        FIG. 2F
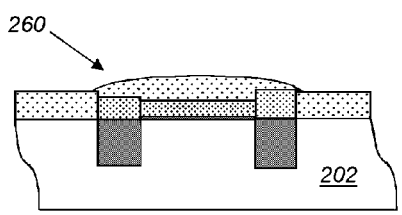 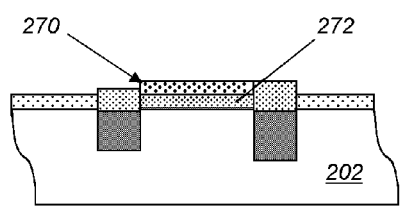
FIG. 2G        FIG. 2H

ULTRAVIOLET, INFRARED AND TERAHERTZ PHOTO/RADIATION SENSORS USING GRAPHENE LAYERS TO ENHANCE SENSITIVITY

RELATED APPLICATIONS

This application is a continuation of co-pending U.S. patent application Ser. No. 13/308,688, filed Dec. 1, 2011, entitled ULTRAVIOLET, INFRARED AND TERAHERTZ PHOTO/RADIATION SENSORS USING GRAPHENE LAYERS TO ENHANCE SENSITIVITY, the entire disclosure of which is herein incorporated by reference.

FIELD OF THE INVENTION

The present application relates generally to bundled nanotube fabrics and methods of making the same.

BACKGROUND OF THE INVENTION

Photodetectors are an integral part of optical circuits and components (for example emitters, modulators, repeaters, waveguides or fibers, reflectors, resonators, detectors, IR Focal plane arrays, UV microchannel arrays and THZ diode detectors etc.) and are used for the sensing of electromagnetic radiation. There are several approaches to these devices. Photoconducting materials, typically semiconductors, have electrical properties that vary when exposed to electromagnetic radiation (i.e. light). One type of photoconductivity arises from the generation of mobile carriers (electrons or holes) during absorption of photons. For semiconducting materials, the absorption of a specific wavelength of light, hence photon energy, is directly proportional to the band gap of the material ($E_g$=hn=hc/l, where $E_g$ is the materials band gap, h is Plank's constant ($4.136 \times 10^{-15}$ eVs), c is the speed of light in a vacuum ($2.998 \times 10^{10}$ cm/s) and l is the wavelength of the radiation). If the band gap energy is measured in eV (electron Volts) and the wavelength in micrometers, the above equation reduces to $E_g$=1.24/l. A photodiode (i.e. p-n diode, p-i-n photodiode, avalanche photodiode, etc.) is the most commonly employed type of photoconductor.

Light detection is ideally suited for direct band gap semiconductors such as Ge and GaAs. However, indirect band gap semiconductors (where an additional phonon energy is needed to excite an electron from the valence band to the conduction band), such as Silicon, are also used as photodetectors. A widely known type of photodetectors is the solar cell, which uses a simple p-n diode or Schottky barrier to detect impinging photons. Besides silicon, most photodetectors disadvantageously do not integrate with existing microelectronics technology, usually detect only a specific wavelength (i.e. 1.1 mm for Si, 0.87 mm for GaAs, 0.414 mm for a-SiC and 1.89 mm for Ge), and require multiple detectors to detect a broad band of wavelengths (hence photon energy).

Besides photodiodes, there are other types of photodetectors that do not rely on the generation of current through the excitation of electrons (or holes). One type of detector is the bolometer. Bolometers operate by absorbing radiation, which in turn raises the temperature of the material and hence alters the resistance of the material. For useful background information on bolometers and semiconductor devices, refer to Kwok K. NG, "Complete Guide to Semiconductor Devices," IEEE Press, John Wiley & Sons, 2002, pages 532-533. Bolometers can be constructed from metallic, metallic-oxides or semiconducting materials such as vanadium oxide and amorphous silicon. Since bolometers detect a broad range of radiation above a few microns, bolometers are typically thermally stabilized to reduce the possibility of detection of blackbody radiation that is emitted from the detector material, which leads to a high background noise. Unlike other detector technologies, IR microbolometer detectors and arrays advantageously do not require cooling to cryogenic temperatures unlike the other detector technologies discussed.

Typical band-gaps for carbon nanotubes (CNTs) range from approximately 0.6-1.2 eV, depending on the diameter of the CNT, where the band gap is proportional to the inverse diameter of the nanotube. These energies correlate to the ability of the nanotubes to detect radiation in the near IR range. Since nanotubes also generate heat and phonons by several processes (e.g., injection of electrons, impinging with radiation, etc.), a CNT fabric is also ideally suited as an IR detector. For graphene, which has a zero electron volt band gap, high mobilities (approximately 100,000 cm2/Vs) and carrier saturation velocities on the order of approximately 5×10E7 cm/s, the nanoribbons can serve as either photodetectors or a microbolometer through modulation of the temperature coefficient of resistance of the graphene layer(s).

An existing prior art microbolometer utilizes vanadium oxide as the element which changes impedance for incoming IR radiation. Typically 2% per degree C. is the highest thermal coefficient of resistance achievable. This performance is limited by 1/f noise and the basic physical properties of the vanadium oxide film. The VOx based micro bolometer is fabricated on top of the CMOS readout circuit, which provides a cost benefit.

Accordingly, it is desirable to provide carbon nanotube based UI, IR and THZ radiation and light detecting systems to enhance overall sensitivity of the system.

SUMMARY OF THE INVENTION

The present invention overcomes the disadvantages of the prior art by providing a light detector includes a single graphene layer or multiple layers article in electrical communication with a first and a second contact; and a detection circuit in electrical communication with the first and second contacts. The detection circuit provides electrical outputs for sufficient light detection from the nanotube article in the proximity of the predefined region by use of preamplification.

In accordance with an illustrative embodiment, the predefined region where graphene layer(s) are situated on a cantilever beam that provides thermal isolation from the surrounding environment.

According to an illustrative embodiment, the predefined region is between two electrical contacts. These electrical contacts provide electrical communication but also are designed for maximum thermal isolation. In addition in order to create low electrical resistance graphene to interconnect connection, the use of Palladium or platinum is required to enhance pi bond connects in the graphene phase and the metal interconnects.

In accordance with an illustrative embodiment, the graphene based detector invention light detection arrays can be integrated with semiconductor circuits including CMOS circuits which provide pixel array x-y controls, pre-amplification of the modulated resistance signal from the IR detector and the conversion of the analog signal to digital.

According to an illustrative embodiment, the graphene nanoribbon film(s) increase the temperature coefficient of resistance from state of the art of 0.025 per degree Centigrade to in excess of 0.04% per degree centigrade.

In accordance with an illustrative embodiment, the graphene based microbolometer detects light by resistance changes in the fabric due to heating.

According to an illustrative embodiment, the IR detector no longer suffers from the Nyquist frequency limitation. This is due to the fact that the Nyquist frequency limitation is due to the presence of 1/f or flicker noise. The use of graphene ribbons exhibit non measurable noise sources, and thus the IR detector no longer suffers from the Nyquist frequency limitation. Within optical systems with fl, the elimination of Nyquist limited behavior significantly improves the performance of IR detection systems.

BRIEF DESCRIPTION OF THE DRAWINGS

The invention description below refers to the accompanying drawings, of which:

FIG. 1 is a schematic diagram of a microbolometer detecting element according to an illustrative embodiment employing a graphene sensing element fabricated on a generic CMOS wafer process;

FIG. 2A is a schematic diagram of the resulting structure after a first step is performed in fabrication of a graphene based IR detector, in which a film is deposited on a substrate and standard photolithography creates a hole over the tungsten (W) plugs, according to the illustrative embodiment;

FIG. 2B is a schematic diagram of the resulting structure after another step is performed in the fabrication of the IR detector, in which a thin film of Cu is deposited, according to the illustrative embodiment;

FIG. 2C is a schematic diagram of the resulting structure after another step is performed in the fabrication of the IR detector, in which a layer of amorphous silicon is deposited, according to the illustrative embodiment;

FIG. 2D is a schematic diagram of the resulting structure after another step is performed in the fabrication of the IR detector, in which the layer of amorphous silicon is planarized using chemical-mechanical polishing, according to the illustrative embodiment;

FIG. 2E is a schematic diagram of the resulting structure after another step is performed in the fabrication of the IR detector, in which contact holes are provided through the amorphous silicon and silicon oxide layers, thereby clearing the material down to the underlying tungsten (W) plus, according to the illustrative embodiment;

FIG. 2F is a schematic diagram of the resulting structure after another step is performed in the fabrication of the IR detector, in which standard CMOS interconnect metallurgy is deposited, according to the illustrative embodiment;

FIG. 2G is a schematic diagram of the resulting structure after another step is performed in the fabrication of the IR detector, in which a graphene layer is deposited, according to the illustrative embodiment;

FIG. 2H is a schematic diagram of the resulting IR detector after the final step is performed in the fabrication of the IR detector, in which the graphene layer is masked off to create the image detector design desired and the amorphous silicon in the cavity is etched, according to the illustrative embodiment;

DETAILED DESCRIPTION

Figure 2I:
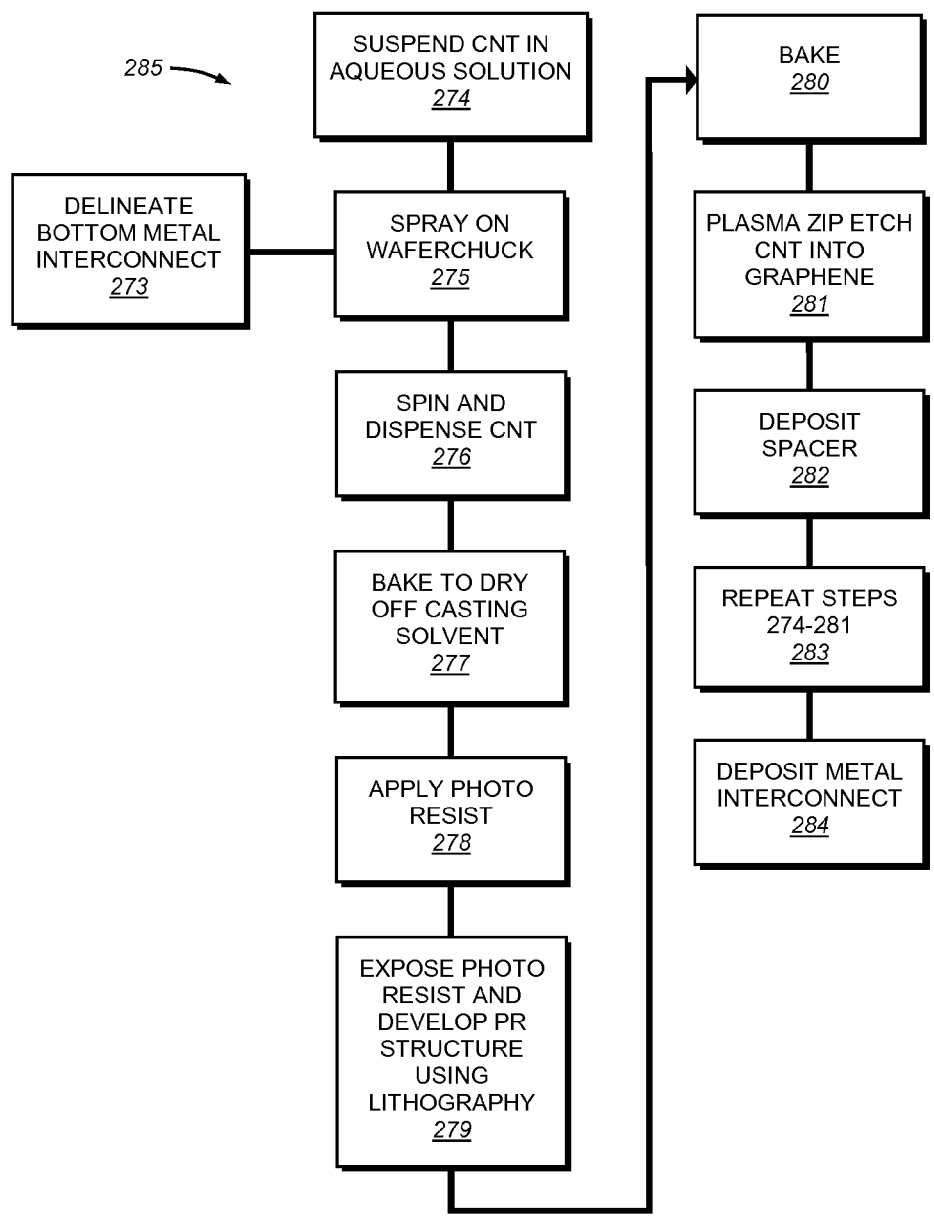
FIG. 2I is a flow chart of a procedure for the fabrication of graphene from carbon nanotubes, according to the illustrative embodiment.

Devices including graphene single layers or multilayers suspended over gaps (for example, gaps of approximately 50-250 nm) can be employed as Infrared (IR) radiation detectors. In addition, the application of graphene single layer or multilayers on a thermally isolated cantilever beam can be employed as an IR radiation detector. One possible technique that can be used to detect electromagnetic radiation is a resistive type microbolometer that changes its electrical resistance as its temperature rises due to the absorption of electromagnetic radiation.

Graphene based detectors have several important and unique features that are not available with existing technologies. First, arrays of these nanotube light detectors can be formed using patterning technology at minimum dimensions of the lithography node used or dictated by the demands of the optical imaging system. It is possible to create 25, 17, or 8 micron square or less detectors limited only by photolithography techniques.

Although most of the illustrative embodiments herein are described as though the fabric is made of nanotubes of the same type, (e.g., all single-walled), the fabrics can be composed of all multi-walled structures or of a combination of single- and multi-walled structures which are processed into graphene nanoribbons.

Illustrative embodiments of the invention allow integration at a level of one light detector per ten or less transistors at the minimum dimension of a given lithography node or the integration of large arrays that are addressed by CMOS pre-amplification or readout and logic circuits. Previously only discrete components, such as silicon p-n diodes, could be used as light detectors for optoelectronic circuits. Other types of detectors require complex and difficult fabrication techniques such as flip-chip processes to integrate with silicon semiconductor technology. Because CNT light sensors can be integrated to form VLSI arrays, which allows for optical interconnects having one light detector per transistor (or waveguide, depending on function), the fabrication of ultra-dense optical circuits is possible.

According to illustrative embodiments, light detecting elements have a suspended region of nanofabric overlying a substrate material. FIG. 1 shows a schematic diagram of an IR detector having a graphene based fabric sensing element fabricated on a generic CMOS wafer. The IR detector incorporates a graphene based fabric sensing element for performing the infrared detection. The IR detector 100 includes a conventional P-N junction substrate 101, which is part of the overall CMOS logic 110. The substrate 101 can comprise silicon using a Bridgman float zone technique. There is a film 120 deposited on the substrate 101 as well as the graphene nanoribbon IR sensors 130, for performing the IR detection. The film 120 can comprise a silicon oxide layer based upon the absorption frequency for the type of device. The IR detector 101 is fabricated in accordance with the procedures outlined in FIGS. 2A through 2I.

Light detectors can be constructed using suspended or non-suspended nanotube-based fabrics in combination with appropriate substrates. Fabrication techniques to develop such horizontally- and vertically-disposed fabrics and devices composed of nanotube fabrics which comprise redundant conducting nanotubes may be created via CVD, or by room temperature operations as described herein. For useful background material on fabrication of carbon nanotubes, refer to U.S. Pat. No. 6,706,402, and published PCT Application No. WO 01/03208, which are expressly incorporated by reference herein. Such detectors can be part of a scheme involving signal transmission or use in a display.

The substrate material 101 can be an insulator such as one described hereinabove or can be a semiconductor (such as, but not limited to, Si (single crystal, polycrystalline and amorphous), Ge, SiGe, SiC, Diamond, GaN, GaAs, GaP, AlGaAs, InP, GaP, CdTe, AlN, InAs, $Al_xIn_{1-x}P$, and other III-V and II-VI semiconductors) or a conductor (such as, but not limited to, Al, Cu, W, Al(<1% Cu), Co, Ti, Ta, W, Ni, Mo, Pd, Pt, TiW, Ru, $CoSi_x$, $WSi_2$, $TiSi_x$, TaN, TiN, TiAlN, RuN, RuO, PtSi, $Pd_2Si$, $MoSi_2$, $NiSi_x$). The substrate material systems can be chosen for circuitry technologies and light absorption considerations, the graphene fabric and associated microbolometer structure processing are compatible with all of these materials. The suspended region (see region 272 of FIG. 2H) defines the electromagnetic sensing region of the detecting element 100.

Figure 5:
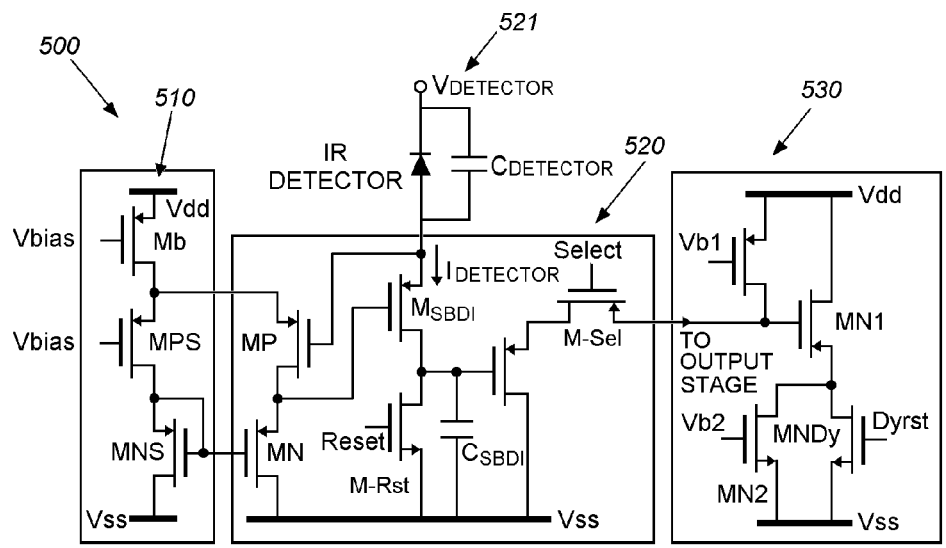
FIG. 5 is a schematic diagram of the CMOS readout circuit for the graphene IR detector, in accordance with the illustrative embodiments.

The light detection from the detecting element 130 is controlled by driving circuitry. Refer to FIG. 5 for a diagram of exemplary driving circuitry 510, 520, 521 and 530.

The layers may have thickness of about 1 nm or less, i.e., the thickness of a given nanotube, or may be composed of several layers of overlapping graphene layers to create a multilayered film of >>10 nm. The nanotube fabric can be grown or deposited on a surface, as described above, to form a contiguous film of a given density. This film can then be patterned to a minimum feature size of 1 nm, corresponding to a single nanotube left in the article. More typically, the lower dimension sizes of the nanotube film are a consequence of lithographic technology limitations and not any limitations inherent in the preferred embodiments of the invention. After patterning, graphene layers can be further integrated with metal interconnects and dielectric passivation layers to create a circuit element. Refer to FIGS. 2A-2I for a detailed description of the fabrication techniques.

Light detectors can be constructed using suspended or non-suspended nanotube-based fabrics in combination with appropriate substrates. Fabrication techniques to develop such horizontally- and vertically-disposed fabrics and devices composed of nanotube fabrics which comprise redundant conducting nanotubes may be created via CVD, or by room temperature operations as described herein and others known in the art. Detectors can be part of a system involving signal transmission or use in a display.

Light can be impinged on the open area of these bundled carbon nanotube fabrics to cause the generation of heat in the fabric, such as a bolometer. Or in the case of the phototransistor based photodetectors the absorbed light carriers Suspended graphene layers are ideal structures for monolayered fabrics, which have a high porosity. Since the substrate may influence the detection of radiation, the suspended region should diminish any disadvantageous substrate thermal isolation effects.

Reference is now made to FIGS. 2A-2H, showing the various stages of the fabrication procedure for an IR detector incorporating graphene layers. As shown in FIG. 2A, using standard CMOS microelectronics processing techniques, a deposited silicon oxide film 201 is deposited on the substrate 202. A standard photolithography method, known in the art, is used to create a hole 205 over the tungsten (W) plugs. The Tungsten plugs 203 serve as interconnects to the underlying CMOS pre-amplification circuitry 204. Refer to FIG. 5 for a diagram of an exemplary CMOS circuitry. The next step, as shown in FIG. 2B, is to use electron beam evaporation or Direct current sputtering to deposit a thin film of Copper (Cu) 211 which serves as an IR photon reflector.

As shown in FIG. 2C, in the next step of the fabrication process a layer of amorphous silicon 220 is deposited and planarized using chemical-mechanical polishing to result in the amorphous silicon 230 of FIG. 2D. The next step is use standard photolithography techniques using a photoresist stencil and reactive ion etching to etch contacts holes 240 through the amorphous silicon and silicon oxide layers clearing the material down to the underlying tungsten plugs which serve as interconnects to the underlying CMOS circuitry, as shown in FIG. 2E. The next step is to use direct current sputtering to deposit standard CMOS interconnect metallurgy, aluminum-copper thin films 250. Standard photolithographic/dry etch techniques are used to delineate the interconnect structures, as shown in FIG. 2F. The next step, as shown in FIG. 2G, is to deposit graphene layer(s) 260. The final steps are to mask off the graphene fabric and employ standard photolithographic methods to create the image the detector design required. Finally using XeFl2 (Xenon Difluoride) etching, or other techniques known in the art, the amorphous silicon in the cavity is etched and a gap or cavity 272 is created, which results in the fully fabricated device as shown in FIG. 2H having a suspended region of nanofabric 270 overlying the gap 272. Also refer to FIG. 3 for a perspective view of the fully fabricated device.

Reference is made to FIG. 2I, illustrating a flow chart of a procedure for the fabrication of graphene from carbon nanotubes. It is assumed throughout that, with the exception of the Zip Plasma Etch portion, standard microelectronic processing and processing known in the art is utilized. At step 274, the single wall carbon nanotubes are suspended in a aqueous or organic solvent solution. The concentration of the single wall nanotubes is optimized to maximize surface coverage of the coated surface. There are two techniques for optimization of surface coverage: one where the unzipped CNTs cover the entire surface and another where layers of graphene are deposited on top of each other. Both conditions are conducive to detector functionality after optimization of electrolyte penetration. The interconnect metals are deposited at step 273, and the metals can include aluminum, aluminum copper, copper, palladium and platinum.

Steps 275, 276 and 277 in the process 285 use Semiconductor Industry standard photoresist apply, bake and dry equipment. These correspond to the steps shown, respectively, in FIGS. 2A and 2B as elements 201 through 205. An optimization process using design of experiments methodology optimizes for graphene and adhesion to the underlying surface. At steps 275, 276 and 277, quantity, chuck rotation speed and bake temperatures are optimized for surface coverage and thickness.

Using standard photoresist and lithographic techniques the features of the detector design are created in photoresist at step 278. After photoresist dispense, the entire wafer is exposed to an oxygen plasma at step 279, the areas of CNTs not covered by the photoresist will be removed by the plasma. In the next step the photoresist is removed and the graphene exposed structures are baked at step 280.

The plasma zip portion of the process at step 281 uses hydrogen and hydrogen compounds in a low temperature plasma environment. Various types of plasma equipment can be utilized, glow discharge, diode, reactive ion etch, and Electron-cyclonic resonance configurations. The pressure and incident power regimes are optimized for each type of plasma reactor configuration for optimal performance. Pressure regimes are between approximately 10 mTorr and 300 mTorr with incident power and process pressure requiring process optimization for each reactor type and can vary within the scope of ordinary skill.

Figure 7A:
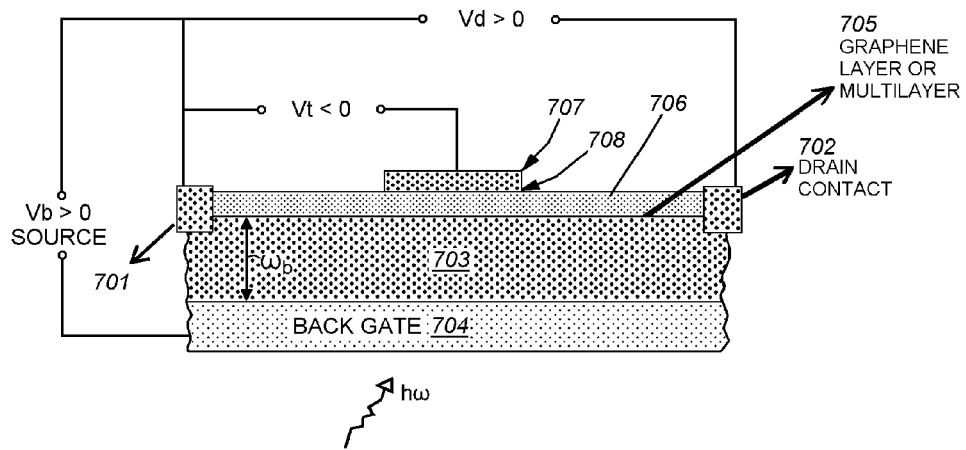
FIG. 7A is a schematic diagram of a photo-field effect transistor device structure incorporating a graphene layer or multilayer, in accordance with the illustrative embodiments.

One indicator for process optimization is to use CNT based field effect transistors (for example as shown in FIG. 7A) and measure the ratio of the current on over the current off. After the optimized space is determined then the process is further optimized by examining the graphene sheets with Transmission Electron Microscope for defects, electronic mobility and degree of CNT rupture.

After the graphene sheets are created then the space is deposited at step 282, the second graphene electrode is fabricated at step 283 by repeating steps 274-281, and the final interconnect metal is deposited and etched at step 284. At this point in the process the fabricated IR detector is ready for use and/or testing. In further illustrative embodiments, the wafers are ready for further device processing for RF, analog, digital and power microelectronics.

Figure 3:
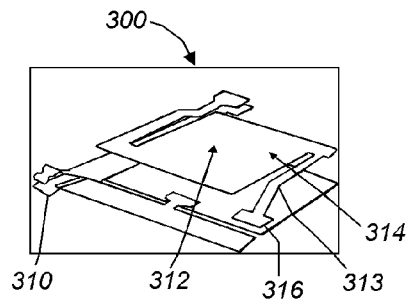
FIG. 3 is a perspective view of the fully assembled graphene based microbolometer, in accordance with an illustrative embodiment.
Figure 4:
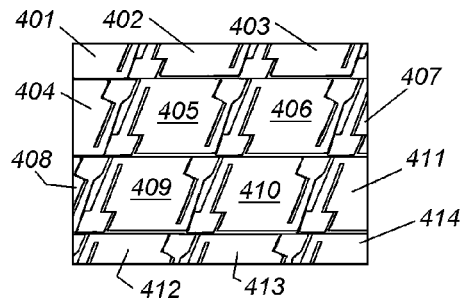
FIG. 4 is a top view of an array of graphene based microbolometers, in accordance with the illustrative embodiments.

Reference is now made to FIG. 3, showing a perspective view of a fully assembled graphene based microbolometer, according to an illustrative embodiment. A graphene based microbolometer structure 300 is shown, having readout locations 310. The structure 300 includes a graphene nanoribbon fabric 312 suspended above the substrate 313, in accordance with the techniques described herein and readily apparent to those having ordinary skill. The thermally isolated cantilever structure 314 is also shown, as well as the connection to tungsten (W) plugs 316. An array of graphene nanoribbon based microbolometers is shown in the top view of FIG. 4, in accordance with the illustrative embodiments. The array 400 of microbolometers includes a plurality of microbolometers 401, 402, 403, 404, 405, 406, 407, 408, 409, 410, 411, 412, 413, and 414.

FIG. 5 is a schematic diagram of an exemplary CMOS readout circuit for the graphene nanoribbon IR detector in accordance with the illustrative embodiments. As shown in the diagram 500, there is a common half circuit 510 operatively connected to a unit cell circuit 520 which includes the IR detector 521. A dynamic discharging output stage circuit 530 is operatively connected to the unit cell circuit 520 to define the overall CMOS readout circuit 500.

Figure 6:
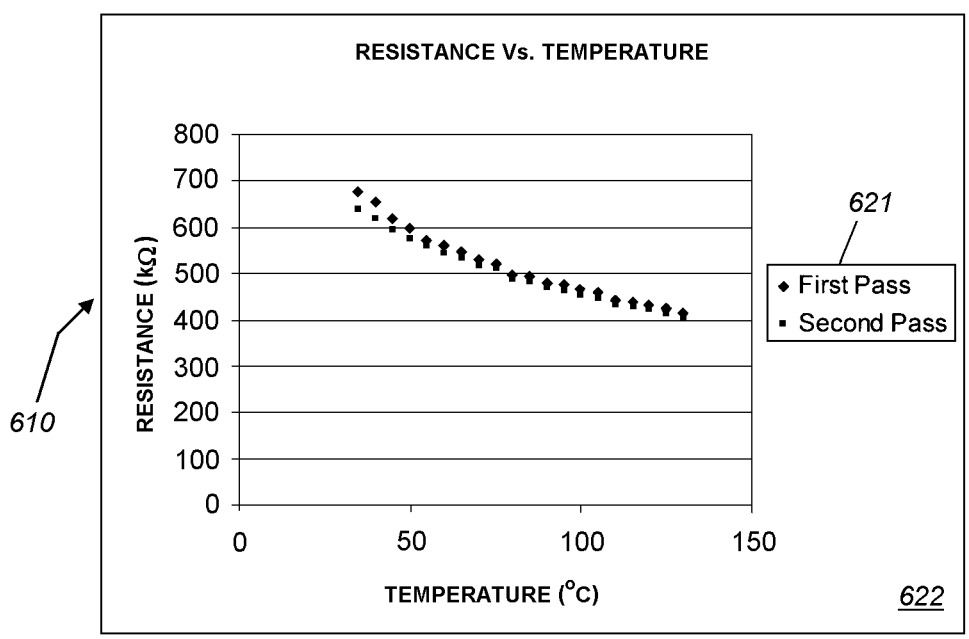
FIG. 6 is a graphical diagram of the measured film resistance of a graphene layer versus temperature, according to the illustrative embodiment.

FIG. 6 is a graphical diagram of the measured film resistance of the graphene nanoribbon fabric versus the temperature, according to the illustrative embodiments. As described hereinabove, the electrical resistance of the microbolometers changes as the temperature rises due to the absorption of electromagnetic radiation in the fabric. This is illustrated in the graphical diagram 610 of FIG. 6. As shown, during both the first pass 621 and the second pass 622, as the temperature increases, the resistance of the microbolometer changes. Accordingly, this allows the structure to be employed as an IR detector in accordance with the illustrative embodiments.

Reference is now made to FIG. 7A showing a schematic diagram of a photo-field effect transistor device structure incorporating a graphene layer or multilayer, according to an illustrative embodiment. As shown, the fully assembled IR detector is operatively connected to source and ground where appropriate to provide a photo-field effect transistor. A source 701 and drain contact 702 are deposited and etched onto a silicon oxide layer 703 that is deposited on a substrate 704, such as silicon, GaAs, or other compound semiconductors. Graphene layers 705 are fabricated and deposited on the silicon oxide layer 703. A CMOS compatible thin film metal 706 is deposited, such as palladium or platinum, upon which the source and drain contacts 701, 702 are fabricated.

A metal or oxide gate electrode 707 is fabricated on top of the graphene layer or layers. The gate electrode 707 can comprise a deposited metal of SiO2, which modulates the current flow across the phototransistor detector. In some embodiments, it may be necessary to fabricate a space 708 between the top of the graphene and the bottom of the metal or silicon oxide gate electrode.

Figure 7B:
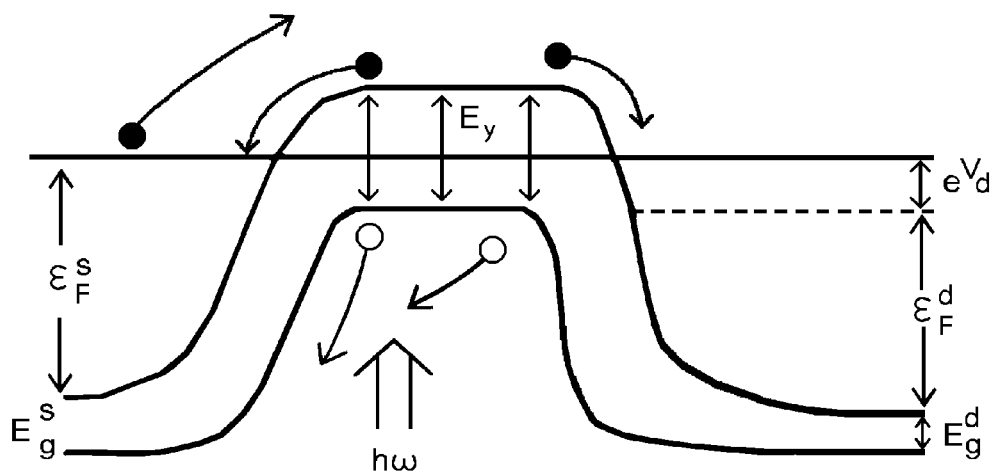
FIG. 7B is a band gap diagram of the structure of FIG. 7A, according to the illustrative embodiments.

FIG. 7B shows a band gap diagram of the photo-field effect transistor of FIG. 7A. As shown, with the initiation of photon illumination, electrons move either towards the Vd level or into the conduction band. Holes move toward the Vg level, thereby creating a depletion region in the p-n junction.

Figure 8A:
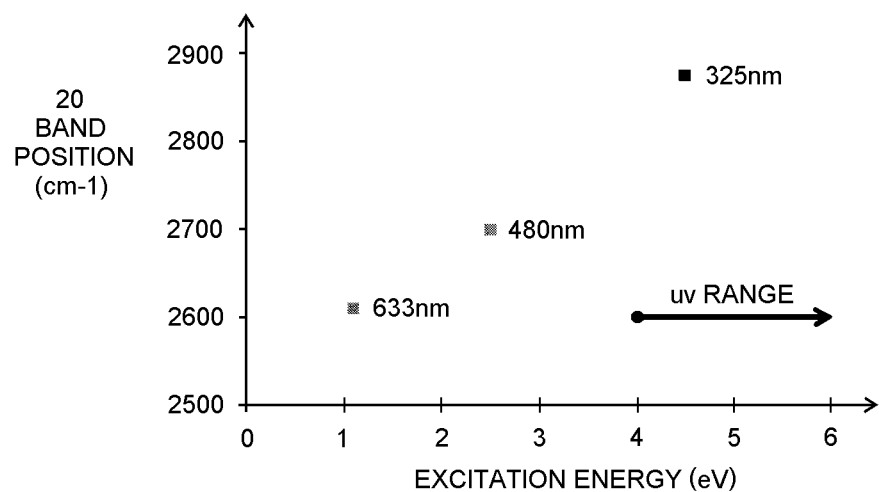
FIG. 8A is a graphical diagram of the Ultraviolet (UV) absorption of a graphene layer, according to the illustrative embodiments.
Figure 8B:
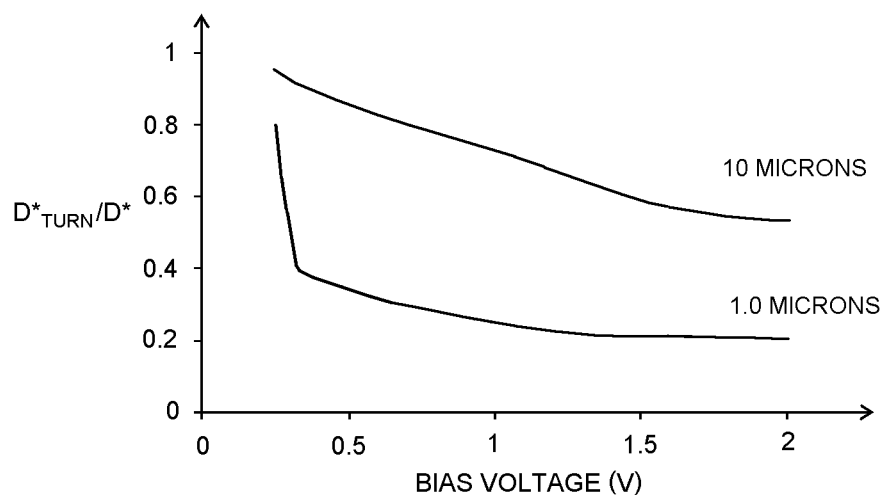
FIG. 8B is a graphical diagram of the Infrared (IR) absorption of a graphene layer, according to the illustrative embodiments.
Figure 8C:
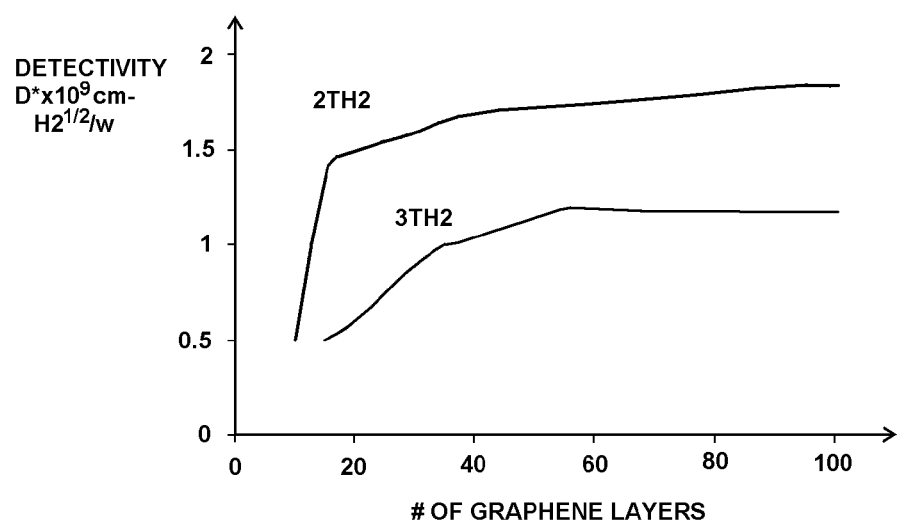
FIG. 8C is a graphical diagram of the Terahertz (THZ) absorption of a graphene layer, according to the illustrative embodiments.

Reference is made to FIGS. 8A, 8B and 8C showing, respectively, graphical diagrams of Ultraviolet (UV), Infrared (IR) and Terahertz (THZ) absorption of a graphene layer. FIG. 8A is a graphical diagram showing the UV absorption of a graphene layer. Note that the UV absorption increases significantly as the excitation energy (eV) is increased. This data demonstrate the ability of the graphene layer to absorb radiation over the bands of the UV range. FIG. 8B shows a graphical diagram of the IR absorption of a graphene layer. As shown, a graphene layer of 10 microns has significantly higher absorption than a graphene layer of 1.0 microns. This increased absorption demonstrates that multiple layers of graphene thereby increases the absolute amount of photon absorption. This enables the tuning of devices to maximize photon absorption as part of the device design. FIG. 8C is a graphical diagram of the THZ absorption of graphene layers, showing the detectivity as a function of the number of graphene layers. Note that the THZ absorption increases as the number of graphene layers increases.

The teachings herein can be embodied in other specific forms without departing from the spirit or essential characteristics thereof. The present embodiments are therefore to be considered illustrative and not restrictive, the scope of the invention being indicated by the appended claims rather than by the foregoing description.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, the electrical connectivity of the cell structure with other cells in an array and/or an external conduit is expressly contemplated and highly variable within ordinary skill. Additionally, it is expressly contemplated that single-wall nanotubes, multi-wall nanotubes, and any combination thereof, can be employed. More generally, while some ranges of layer thickness and illustrative materials are described herein, these ranges are highly variable. IT is expressly contemplated that additional layers, layers having differing thicknesses and/or material choices can be provided to achieve the functional advantages described herein. In addition, directional and locational terms such as "top," "bottom," "center," "front," "back," "on," "under," "above," and "below" should be taken as relative conventions only, and are not absolute. Furthermore, it is expressly contemplated that various semiconductor and thin film fabrication techniques can be employed to form the structures described herein. Accordingly, this description is meant to be taken only by way of example, and not to otherwise limit the scope of this invention.

What is claimed is:

1. A method for converting carbon nanotubes into graphene sheets comprising the steps of:
   providing hydrogen plasma at temperatures of 32-200 degrees Fahrenheit; and
   with the provided plasma, etching latent defects in carbon nanotubes and thereby split the carbon nanotubes in a longitudinal direction resulting in graphene sheets.

2. The method of claim 1 wherein a diameter of the carbon nanotubes is not a factor in the 1 to 5 nm range.

3. The method of claim 1 wherein the hydrogen plasma occurs during gas flow uniformity and radio-frequency uniformity that results in substrate etch uniformity.

\* \* \* \* \*